(12) United States Patent
Wong

(10) Patent No.: US 9,178,508 B2
(45) Date of Patent: Nov. 3, 2015

(54) HIGH VOLTAGE SWITCH WITH TWO OR MORE OUTPUTS

(71) Applicant: Synopsys, Inc., Mountain View, CA (US)

(72) Inventor: Yanyi Liu Wong, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 74 days.

(21) Appl. No.: 14/196,926

(22) Filed: Mar. 4, 2014

(65) Prior Publication Data

US 2015/0256171 A1 Sep. 10, 2015

(51) Int. Cl.
*H03K 3/00* (2006.01)
*H03K 17/687* (2006.01)
*H03K 17/081* (2006.01)
*H03K 17/10* (2006.01)
*H03K 17/08* (2006.01)

(52) U.S. Cl.
CPC .............. *H03K 17/687* (2013.01); *H03K 17/08* (2013.01); *H03K 17/081* (2013.01); *H03K 17/102* (2013.01)

(58) Field of Classification Search
CPC ... H03K 17/08; H03K 17/081; H03K 17/102; H03K 17/687

USPC ........................ 327/108, 112, 333; 326/80, 81
See application file for complete search history.

(56) References Cited

U.S. PATENT DOCUMENTS

| | | | | |
|---|---|---|---|---|
| 5,619,150 | A * | 4/1997 | Briner | 327/55 |
| 5,729,155 | A * | 3/1998 | Kobatake | 326/68 |
| 6,370,071 | B1 * | 4/2002 | Lall et al. | 365/205 |
| 7,580,311 | B2 * | 8/2009 | Pesavento | 365/226 |
| 8,098,088 | B1 * | 1/2012 | Sutandi et al. | 327/427 |
| 8,373,485 | B2 * | 2/2013 | Po et al. | 327/333 |
| 8,749,297 | B2 * | 6/2014 | Sutandi et al. | 327/436 |

* cited by examiner

*Primary Examiner* — Kenneth B Wells
(74) *Attorney, Agent, or Firm* — Fenwick & West LLP

(57) ABSTRACT

Embodiments relate to a single multi-output high-voltage (HV) switch configured to pass multiple HV signals in semiconductor integrated circuits, such as a memory device. By utilizing a single HV switch that shares multiple components, area is reduced and fewer numbers of transistor devices are used to reduce cost. The shared components are selected such that the HV switch configuration provides functionality similar to traditional multiple HV switch configurations. Specifically, common logic shared across different branches of the single HV switch enables the single HV switch to provide multiple HV signals.

20 Claims, 7 Drawing Sheets

HIGH VOLTAGE SWITCH WITH TWO OR MORE OUTPUTS

BACKGROUND OF THE INVENTION

1. Field of the Disclosure

The present disclosure relates to high-voltage switches implemented in CMOS (Complementary Metal-Oxide-Semiconductor) processes.

2. Description of the Related Art

Memory devices are electronic devices arranged to store electrical data. Memory devices typically include a number of memory cells that store individual bits of information. A bit may be represented by one or more voltages stored in a memory cell. For example, a single ended memory cell may store charges in a transistor, one charge level representing a "0" and the other representing a "1," and in turn, current through the transistor is read to determine the value of the bit. A differential memory cell may store charges separately in two transistors. The difference between the currents through the transistors, when compared to a threshold, indicates the value of the bit. Many of these memory cells can be arranged in an array of rows and columns to store many bits of information.

In non-volatile applications, the charges stored in a transistor are stored at a floating gate of the transistor. In order to store and remove charges at the floating gate, high-voltage may be applied to the transistor. Typically, charge pumps generate the high-voltage and high-voltage (HV) switches control the high-voltage signals output to the memory array. Traditionally, a single HV switch is used to generate a single high/low signal of a function, such as the programming or erasing of memory cells within the array. Thus, an embedded memory application may include multiple HV switches that consume substantial area in a memory device in addition to the memory array.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a single multi-output high-voltage (HV) switch configured to pass multiple HV signals in semiconductor integrated circuits. By sharing a single HV switch with multiple components of the semiconductor integrated circuits, the area occupied by the HV switch can be reduced and fewer numbers of transistor devices can be used. Common logic circuit may be used across different branches of the HV switch so that the single HV switch passes HV signals to multiple components.

A high-voltage herein refers to a voltage greater than the supply voltage (or VDD voltage) of a semiconductor integrated circuit. The high-voltage may be, for example, 21V when the supply voltage is, for example, 5 V.

Figure 1A:
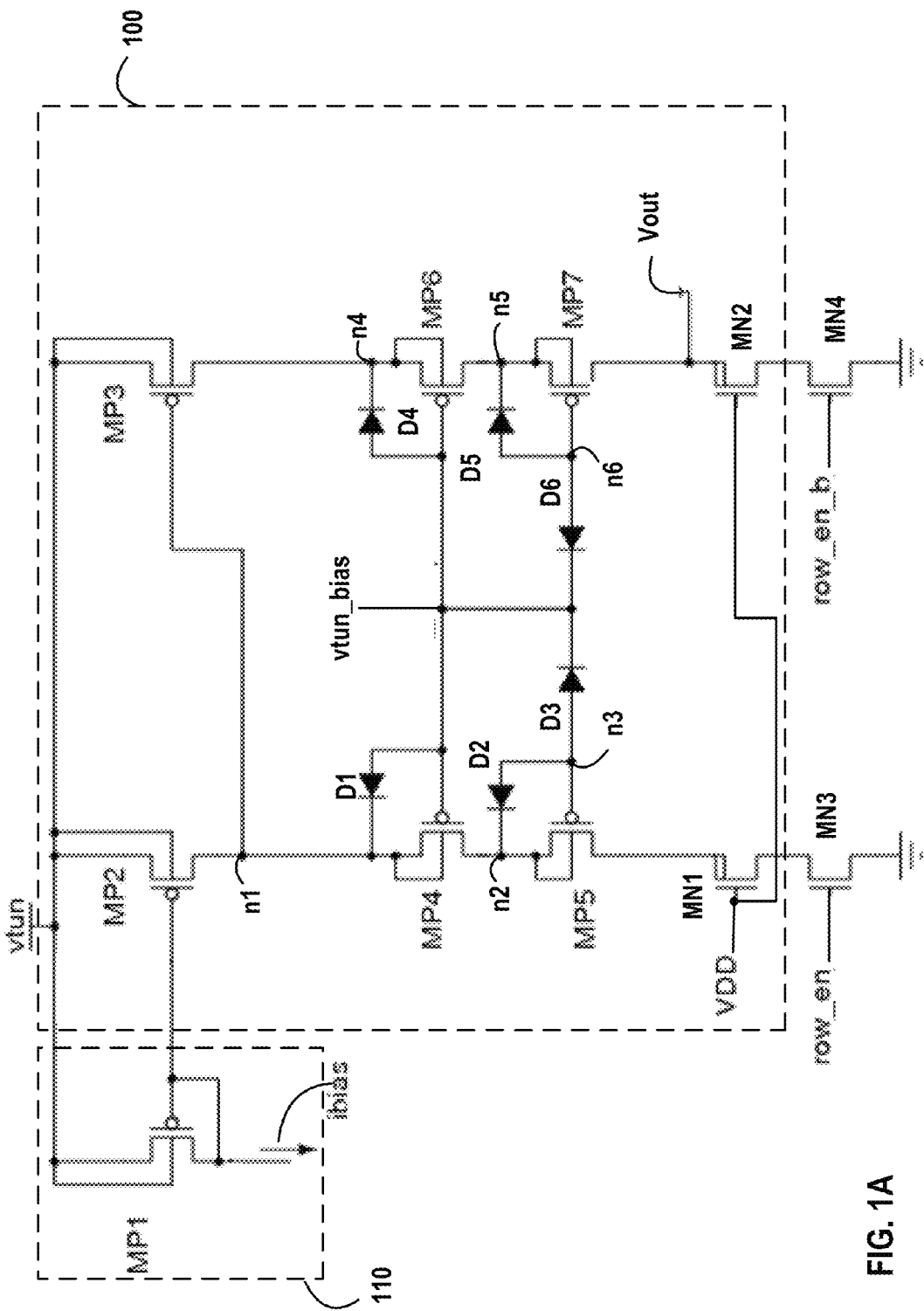
FIG. 1A is a circuit diagram illustrating an example single output high-voltage (HV) switch.

FIG. 1A is a circuit diagram illustrating an example single output high-voltage switch 100. As shown, the switch 100 receives a high-voltage vtun from a high voltage source (not shown), such as a charge pump. In turn, the HV switch 100 passes the high-voltage to output Vout, which may be coupled to a memory cell (not shown) for storing charge to a floating gate or removing charge from a memory cell. For example, the switch 100 may provide the high-voltage (e.g., 21V) at vtun on Vout sufficient for erasing or programming a memory cell.

The switch 100 may include a number of transistor devices such as metal-oxide-semiconductor field-effect transistors (MOSFETs) and diodes. These devices may be created using standard complementary metal-oxide-semiconductor (CMOS) processes. MOSFETs have four-terminals, a source, gate, drain, and body terminal. The body terminal is oftentimes shorted to ground and may be omitted in the FIGS. and corresponding description. Signal level MOSFETs may be of the p-type or n-type and are respectively referred to as pMOS (e.g., MP1 through MP7) and nMOS (e.g., MN3 and MN4) transistors.

Another type of MOFET commonly used in integrated circuits is a laterally diffused metal oxide semiconductor (LDMOS) device, which can include both p-type and n-type LDMOSs. In the context of CMOS technology, LMDOS devices handle higher voltages than traditional signaling pMOS and nMOS transistor devices. For example, signaling pMOS and nMOS transistors may be rated to operate at or below about 2.5-5V while an LDMOS may handle source-drain (and vice versa) voltages beyond vtun. Thus, unlike a signal level MOSFET, an LDMOS device may have a voltage difference of vtun-ground across its drain, gate and/or source terminals. Accordingly, an LDMOS device (e.g., n-type LDMOSs MN1 and MN2) may be implemented in each branch to protect signal level transistor devices.

The switch 100 also includes diodes (e.g., D1-D6). Diodes may be formed in a usual fashion through the coupling of a p-type and n-type semiconductor to respectively form the anode and cathode of a p-n junction diode. Alternatively, an n-type or p-type transistor device may be configured as a diode in a CMOS process. For example, the gate terminal of a pMOS may be coupled to drain of the pMOS to act as the cathode of the diode with the source acting as the anode, thus enabling a diode structure to be readily created in a standard CMOS process.

The switch 100 may be coupled to a current mirror transistor 110 which provides a bias voltage to the switch 100 based on current ibias. In one embodiment, the current mirror 110 includes a pMOS MP1 having its source terminal coupled to vtun and its gate terminal coupled to its drain. Accordingly, the gate terminal of MP1 is maintained at a bias voltage substantially similar to that of its drain terminal (e.g., vtun less the drop across MP1). Components of the switch 100 are coupled to the gate terminal of MP1 to receive the bias voltage.

Control signals row_en and its complementary signal row_en_b control the operation of the switch 100 and thus whether Vout is coupled to vtun for outputting the high-voltage or coupled to the ground voltage (e.g., 0V). An example truth table (table 1) for switch 100 output Vout based on control signals row_en and row_en_b is shown below in Table 1.

TABLE 1

| row_en | row_en_b | Vout |
|---|---|---|
| 0 | 1 | GND (0 V) |
| 1 | 0 | vtun (21 V) |

As shown in Table 1, when row_en is "low" and row_en_b is "high", Vout is coupled to ground and provides the common ground voltage as output of the switch 100. Conversely, when row_en is "high" and row_en_b is "low", Vout is coupled to vtun and provides the high-voltage as output of the switch 100.

Specifically, the control signals row_en and row_en_b control whether MN3 and MN4 conduct current by coupling or decoupling the respective branches with ground. In the first condition of Table 1 when row_en is low and row_en_b is high, MN3 decouples the first branch from ground to substantially prevent the flow of current from vtun to ground in the first branch. Consequently, with the bias voltage from the current mirror transistor 110 at its gate, MP2 pulls node n1 high to vtun. The gate terminal of pMOS MP3 is coupled to the drain terminal of MP2 at node n1 such that the gate of MP3 may be held substantially at vtun voltage. With the source terminal of MP3 at vtun voltage, MP3 remains off.

The source of MP4 is coupled to node n1 and pulled to vtun voltage. MP4 further receives a vtun_bias voltage at its gate, which is set such that the source-gate voltage of MP4 does not exceed the capabilities of the transistor yet the vtun_bias is sufficiently lower than vtun to turn on the transistor and conduct vtun to node n2. For example, with a vtun voltage of 21V, the vtun_bias voltage may be 16V. Node n3 is also set substantially equal (plus the drop across diode D3) to vtun_bias due to the diode D3 preventing node n3 from being substantially higher than vtun_bias. In some embodiments, the voltage at node n3 may be approximately equal to vtun_bias as a result of diode D2's leakage current pulling up node n3 when the vtun voltage is applied at node n2. Hence, MP5 also turns on and applies voltage vtun at the drain of MN1. As MN1 is an LDMOS, it may handle the vtun voltage at its drain with VDD (e.g., 5V) applied at its gate.

When row_en_b is high, MN4 conducts coupling the source of MN2 with ground. With MP3 off and VDD (e.g., 5V) at the gate of MN2, MN2 also conducts, thus MN2 couples Vout to ground. With MP3 off as described above, MP6 and MP7 float and Vout remains at ground.

In the second condition of Table 1, MN3 couples the first branch to ground to substantially allow the flow of current through the first branch. Like in the first condition, MP4 and MP5 are turned on in the second condition. However, rather than vtun_bias forcing MP4 to turn on, the diode drop across D1 with n1 pulled low (coupled to ground when MN3 is turned on) causes MP4 to remain on when the current path is established. In contrast to the first condition, MP5's drain is 0V instead of 21V. Thus, MP5 is in saturation during the second condition and held on while it operates in the triode region during the first condition. Thus, a conduction path is established between the drain of MP2 and ground (e.g., while row_en is "1").

With MP2 conducting and node n1 pulled low, vtun_bias sets the voltage at n1 substantially equal to vtun_bias plus the Vgs of MP4, which is close to the threshold voltage (Vt) of the MP4 transistor. As described above, the vtun_bias voltage is set such that the source-gate voltage (e.g., of MP3) does not exceed the capabilities of the MP3 transistor yet remains sufficiently lower than the voltage vtun to turn on MP3.

Accordingly, with the gate voltage of MP3 substantially biased to vtun_bias plus the Vt of MP4, MP3 coupled to the source of MP6 is turned on to place node n4 at voltage vtun. As the gate of MP6 also receives vtun_bias, MP6 also conducts. Node n6 is also set substantially equal (plus the drop across diode D6) to vtun_bias due to the diode D6 preventing node n6 from being substantially higher than vtun_bias. In some embodiments, the voltage at node n6 may be approximately equal to vtun_bias as a result of diode D5's leakage current pulling up node n6 when the vtun voltage is applied at node n5. Hence, MP7 also turns on and the vtun voltage is applied at Vout and the drain of MN2. In the second condition, row_en_b is low and thus MN4 and MN2 are off, allowing Vout to output the vtun voltage. In embodiments where MN2 is embodied as an LDMOS, it handles the vtun voltage at its drain with VDD (e.g., 5V) applied at its gate. Other embodiments may use other configurations to protect the MN4 transistor from receiving the full vtun voltage at its drain.

During HV switch 100 operation, the diodes D1, D2, D4, and D5 prevent the source-gate voltage of MP4 through MP7 from exceeding design parameters of the transistors, which may cause degradation of the gate oxide and even failure of the device itself. Diodes D2 and D6 enable the voltage at nodes n3 and n6, respectively, to be maintained at a voltage of vtun_bias plus the drop across the diode while preventing the application of vtun_bias at nodes n2 and n5.

Figure 1B:
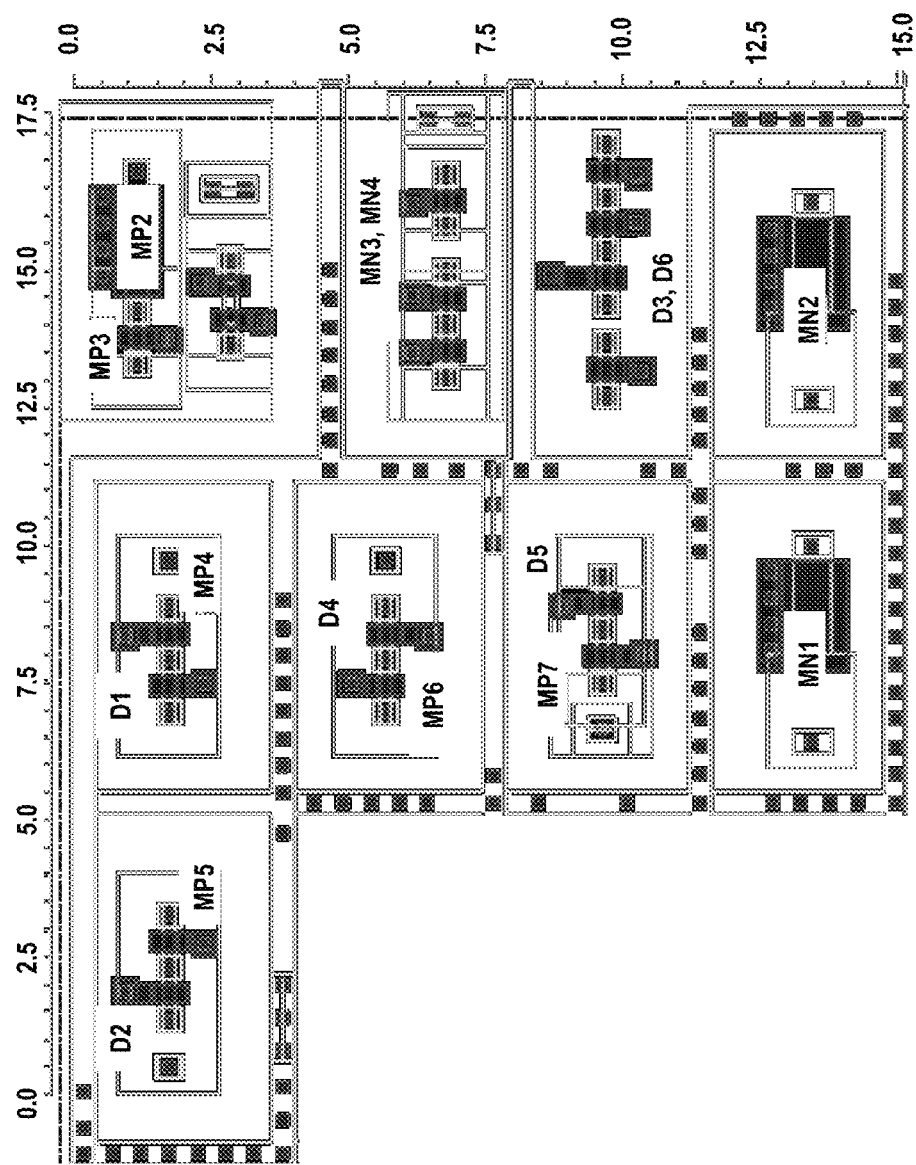
FIG. 1B illustrates an example layout of the HV switch illustrated in FIG. 1A.

FIG. 1B illustrates an example layout of the HV switch 100 illustrated in FIG. 1A. As shown, the layout includes pMOS devices MP2 through MP7, LDMOS devices MN1 through MN2, nMOS devices MN3 through MN4, and diodes D1 through D6. In one embodiment, the layout features are formed using a 0.18 micrometers (μm) CMOS process with the diodes D1 through D6 formed using transistor devices configured as diodes.

The example layout illustrates an overall circuit having an approximate width of 17.5 μm by an approximate length of 15 μm. Importantly, the signal level devices MP2 through MP7, MN3 through MN4 and diodes individually have a very small feature size, thus allowing a relatively high density in comparison to the larger LDMOS devices MN1, MN2 having different construction due to the lateral diffusion region for handling high voltages at their drains.

In traditional HV switches 100, such as that illustrated in FIG. 1A, two such LDMOS devices are included in each HV switch. For a typical memory block, two HW switches 100 are used to provide, separately, voltages for memory program and erase functions. This results in significant increase in circuit area and factors into design cost.

Figure 2:
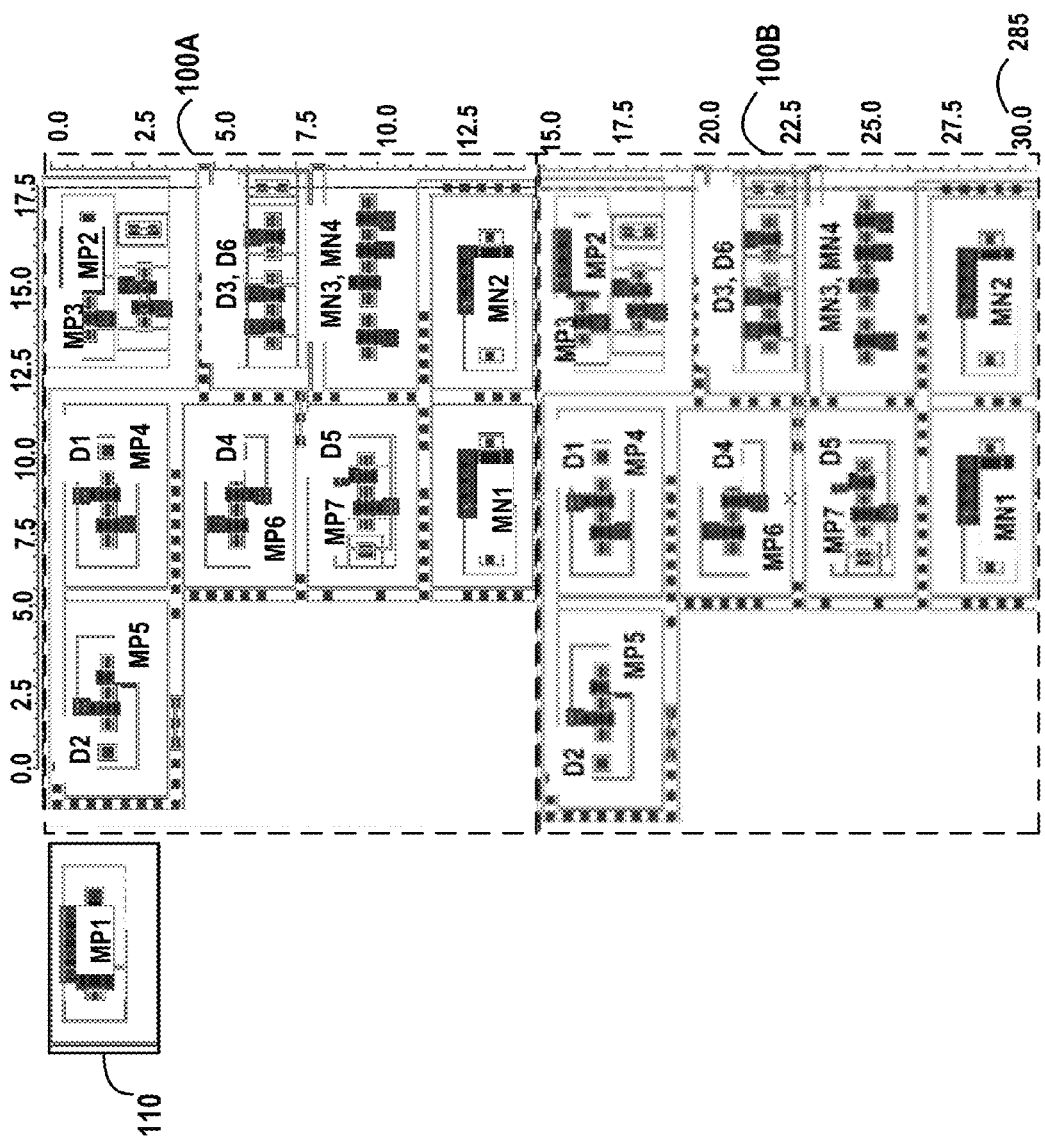
FIG. 2 illustrates a set of HV switches for providing both program and erase voltages to a memory block.

FIG. 2 illustrates a set of HV switches 100 for providing both program and erase voltages to a memory block. Also illustrated is the shared bias circuit 110 including MP1 for providing bias voltages to the HV switches 100A, 100B.

As shown, the required area for the dual switch configuration doubles based on the increase of length 285 to approximately 30.0 µm. By combining branch functionality, the number of LDMOS and signal devices may be reduced in a single HV switch configuration providing program and erase voltages and having reduced area and cost.

Figure 3A:
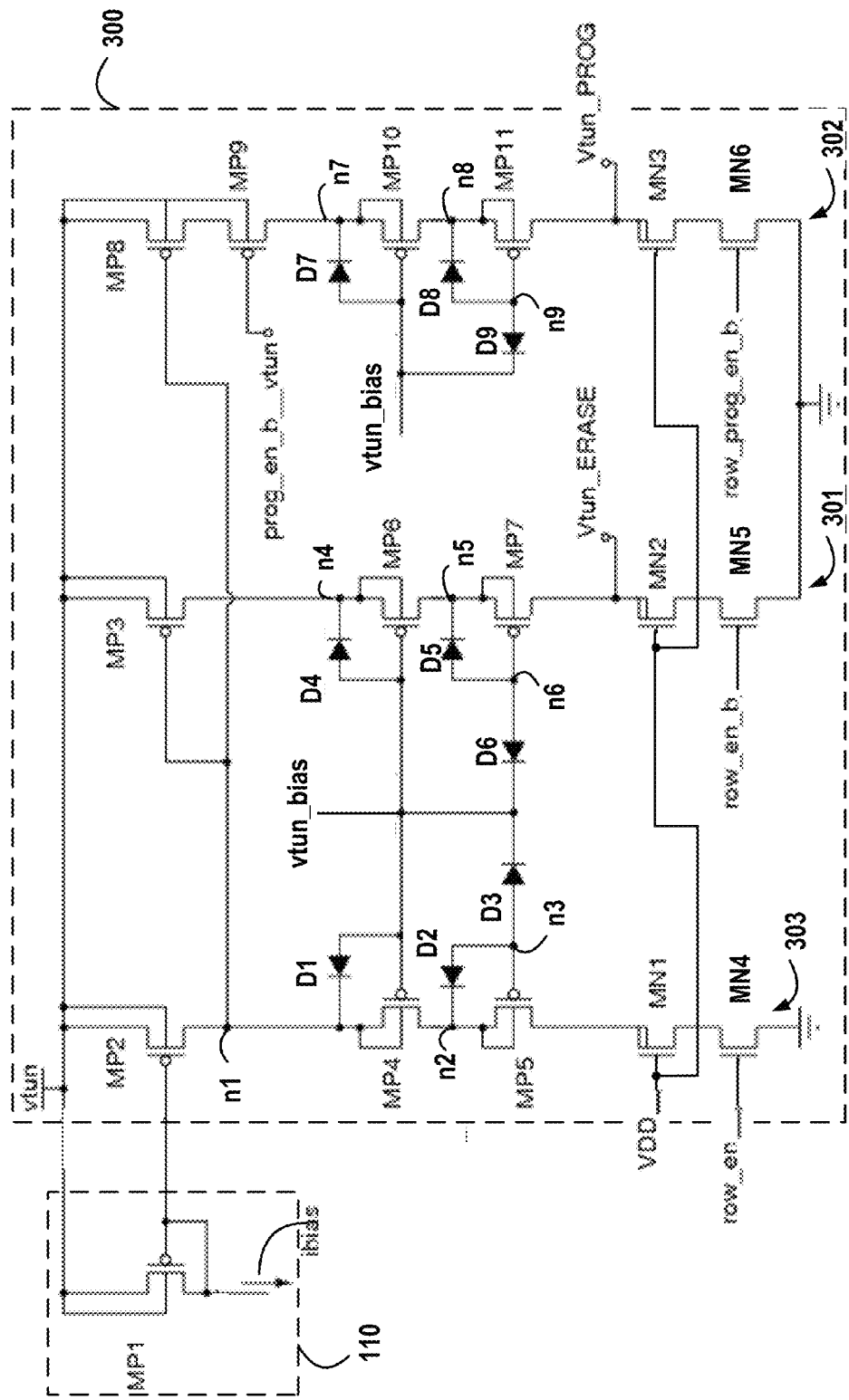
FIG. 3A is a circuit diagram illustrating a HV switch configured to pass multiple HV signals, according to one embodiment.

FIG. 3A is a circuit diagram illustrating a HV switch 300 configured to pass multiple HV signals, according to one embodiment. As shown, the HV switch 300 may pass both Vtun_ERASE and Vtun_PROG (program) signals to a memory device. The HV switch 300 receives a high-voltage at vtun from a high voltage source (not shown), such as a charge pump. In turn, the HV switch 300 passes the high-voltage to output Vtun_ERASE or output Vtun_PROG, which may be coupled to a memory cell (not shown) for storing or removing charge from a floating gate of a memory cell. For example, the HV switch 300 may provide the high-voltage (e.g., 21V) at vtun on either output Vtun_ERASE or output Vtun_PROG for, respectively, erasing or programming a memory cell. In order to provide the additional function, the HV switch 300 includes three branches 301, 302, 303.

The common branch 303 shares functionality with the first 301 and second 302 output branches. As the common branch provides the vtun_bias voltage at node n1 to activate the output branches 301, 302, the output branches may only be active when the common branch is active (i.e., conducting).

The HV switch 300 itself includes a number of transistor devices such as metal-oxide-semiconductor field-effect transistors (MOSFETs) and diodes. In the illustrated embodiment, HV switch 300 includes pMOS MP1 through MP11, nMOS MN4 through MN6 transistors, and diodes D1 though D9. In some embodiments, MN1 through MN3 may be implemented as n-type LDMOSs on each branch to protect signal level transistor devices (e.g., MN4 through MN6.

The HW switch 300 may be coupled to a current mirror transistor 110 having a similar function as the current mirror transistor 110 in FIG. 1A to provides a bias voltage to the switch 300 based on the current ibias.

Control signals row_en, row_en_b, row_prog_en_b, and prog_en_b_vtun control the operation of the switch 300 and thus whether a given output is coupled to vtun for outputting the high-voltage or coupled to ground for outputting the low voltage (e.g., 0V).

An example truth table (table 2) for switch 300 output Vout based on control signals row_en, row_en_b, row_prog_en_b, and prog_en_b_vtun is shown below in Table 2.

ground. Row_prog_en_b is set "high" in the first condition to couple Vtun_PROG of the second output branch 302 to ground to provide the common ground voltage at output Vtun_PROG of the HV switch 300.

In the second condition when row_en is "high" and row_en_b is "low", Vtun_ERASE of the first output branch 301 is pulled to voltage vtun and provides the vtun voltage at output Vtun_ERASE of the HV switch 300. In the second condition, as the common branch 303 is active due to row_en being "high", row_prog_en_b and prog_en_b_vtun may be set to output either the common ground voltage or the vtun voltage on Vtun_PROG of the second output branch 302.

Specifically, row_prog_en_b may be set "high" to couple Vtun_PROG of the second output branch 302 to ground to provide the common ground voltage at output Vtun_PROG of the HW switch 300. As MP8 is turned on due to the common branch 303 being active (as will be explained in more detail below), prog_en_b_vtun is set high to hold MP9 off.

Alternatively, row_prog_en_b may be set "low" to couple Vtun_PROG of the second output branch 302 with vtun to provide the vtun voltage at output Vtun_PROG of the HV switch 300. As MP8 is on due to the common branch 303 being active (as will be explained in more detail below), prog_en_b_vtun is set low to turn MP9 on and pass the vtun voltage.

The control signals row_en, row_en_b, and row_prog_en_b control, respectively, whether MN4, MN5, and MN6 conduct current by coupling or decoupling the respective branches with ground. In the first condition of Table 2 when row_en is low and row_en_b is high, MN4 decouples the common branch 303 from ground to substantially prevent the flow of current through MN1 in the common branch 303. Consequently, with the bias voltage from the current mirror transistor 110 at its gate, MP2 pulls node n1 high to vtun. The gate terminals of MP3 and MP8 are coupled to the drain terminal of MP2 at node n1 such that the gates of MP3 and MP8 may be held substantially at vtun voltage. With the source terminals of MP3 and MP8 at vtun voltage, MP3 and MP8 remain off.

The source of MP4 is coupled to node n1 and pulled to vtun voltage. MP4 further receives a vtun_bias voltage at its gate, which is set such that the source-gate voltage of MP4 does not exceed the capabilities of the transistor yet the vtun_bias is sufficiently lower than vtun to turn on the transistor and conduct the vtun voltage to node n2. For example, with a vtun voltage of 21V, the vtun_bias voltage may be 16V. Node n3 is also set substantially equal (plus the drop across diode D3) to vtun_bias due to the diode D3 preventing node n3 from being substantially higher than vtun_bias. In some embodiments,

TABLE 2

| row_en | row_en_b | row_prog_en_b | prog_en_b_vtun | Vtun_ERASE | Vtun_PROG |
|---|---|---|---|---|---|
| 0 | 1 | 1 | X [either 21 V or 16 V] | GND (0 V) | GND (0 V) |
| 1 | 0 | 1 | 1 [Vtun (21 V)] | Vtun (21 V) | GND (0 V) |
| 1 | 0 | 0 | 0 [Vtun_bias (16 V)] | Vtun (21 V) | Vtun (21 V) |

As shown in Table 2, in a first condition when row_en is "low" and row_en_b is "high", Vtun_ERASE of the first output branch 301 is coupled to ground and provides the common ground voltage at output Vtun_ERASE of the HV switch 300. In the first condition, as the common branch 303 is inactive due to row_en being "low", the second output branch 302 may not output Vtun regardless of the condition of prog_en_b_vtun due to the MP8 transistor being held off while the MN6 transistor is on and shorts Vtun_PROG to the voltage at node n3 may be approximately equal to vtun_bias as a result of diode D2's leakage current pulling up node n3 when the vtun voltage is applied at node n2. Hence, MP5 also turns on and applies vtun voltage at the drain of MN1. As MN1 is an LDMOS, it may handle the vtun voltage at its drain with VDD (e.g., 5V) applied at its gate.

When row_en_b is high, MN5 conducts coupling the source of MN2 with ground. With MP3 off and VDD (e.g., 5V) at the gate of MN2, MN2 also conducts, thus MN2 couples Vtun_ERASE to ground. With MP3 off as described above, MP6 and MP7 float and Vtun_ERASE remains at the ground voltage.

Similarly, if row_prog_en_b is set high, MN6 conducts coupling the source of MN3 with ground. With MP8 off and VDD (e.g., 5V) at the gate of MN3, MN3 also conducts, thus MN3 couples Vtun_PROG to ground. With MP8 off as described above, MP10 and MP 11 float and Vtun_PROG remains at the ground voltage. If row_prog_en_b is set low, the second output branch 302 allows Vtun_PROG to float as neither MP8 nor MN3 are conducting.

In the second condition of Table 2, MN4 couples the source of MN1 to ground to substantially allow the flow of current from vtun to ground through the common branch 303. Like in the first condition, MP4 and MP5 are turned on in the second condition. However, rather than vtun_bias forcing MP4 to turn on, the diode drop across D1 with n1 pulled low (coupled to ground when MN3 is turned on) causes MP4 to remain on when the current path is established. In contrast to the first condition, MP5's drain is 0V instead of 21V. Thus, MP5 is in saturation during the second condition and held on while it operates in the triode region during the first condition. Thus, a conduction path is established between the drain of MP2 and ground (e.g., while row_en is "1").

With MP2 conducting and node n1 pulled low, vtun_bias sets the voltage at n1 substantially equal to vtun_bias plus the Vgs of MP4, which is close to the Vt of the MP4 transistor. As described above, the vtun_bias voltage is set such that the source-gate voltage (e.g., of MP3 and MP8) does not exceed the capabilities of the MP3 and MP8 transistors yet remains sufficiently lower than vtun to turn on MP3 and MP8.

Accordingly, with the gate voltage of MP3 substantially biased to vtun_bias plus the Vt of MP4, MP3 coupled to the source of MP6 in turned on to place node n4 at voltage vtun. As the gate of MP6 also receives vtun_bias, MP6 also conducts. Node n6 is also set substantially equal (plus the drop across diode D6) to vtun_bias due to the diode D6 preventing node n6 from being substantially higher than vtun_bias. In fact, the voltage at node n6 may be approximately equal to vtun_bias as a result of diode D5's leakage current pulling up node n6 when the vtun voltage is applied at node n5. Hence, MP7 also turns on and applies vtun voltage at Vtun_ERASE and the drain of MN2. In the second condition, row_en_b is low and thus MN5 and MN2 are off, allowing Vout_ERASE to output the vtun voltage. In embodiments where MN2 is embodied as an LDMOS, it handles the vtun voltage at its drain with VDD (e.g., 5V) applied at its gate. Other embodiments may use other configurations to protect the MN5 transistor from receiving the full vtun voltage at its drain.

In the second condition for the illustrated HV switch 300 configuration, Vout_ERASE always outputs the vtun voltage. However, in other embodiments, an additional transistor device and corresponding signal input may be added to the first output branch 301 (e.g., in the same position as MP9 in the second output branch 302) to deactivate the branch 301 while still providing area savings. Additionally, in yet another embodiment, row_en_b may be provided as a discrete signal such that when the additional transistor device is turned off, Vtun_ERASE may be coupled to ground to output the ground voltage in the second condition.

Similar to MP3 in the first output branch 301 in the second condition, with MP2 conducting and node n1 pulled low such that vtun_bias sets the voltage at n1 substantially equal to vtun_bias plus the Vgs of MP4, which is close to the Vt of the MP4 transistor, the gate voltage of MP8 in the second output branch 302 is substantially biased to vtun_bias plus the Vt of MP4. As described above, the vtun_bias voltage is set such that the source-gate voltage of MP8 does not exceed the capabilities of the transistor yet is sufficiently lower than vtun to turn on the transistor and conduct the vtun voltage to the source of MP9.

The gate of MP9 receives control signal prog_en_b_vtun, which has a high value of vtun (21V) and a low value of vtun_bias (16V). As MP9 is active low, MP9 conducts when prog_en_b_vtun is low (16V) to apply the vtun voltage at node n7 in the second condition. The Vtun_bias of 16V is applied to the gate of MP9 such that the source-gate voltage of MP9 does not exceed the design threshold of the transistor.

The source of MP10 is coupled to node n7, the drain to node n8, and the gate to vtun_bias. As the gate of MP10 is biased to the vtun_bias voltage, MP10 also conducts. Node n9 is also set substantially equal (plus the drop across diode D9) to vtun_bias bias due to the diode D9 preventing node n9 from being substantially higher than vtun_bias. In some embodiments, the voltage at node n9 may be approximately equal to vtun_bias as a result of diode D8's leakage current pulling up node n9 when the vtun voltage is applied at node n8. Hence, MP11, which is coupled between node n8 and Vtun_PROG also turns on to apply the vtun voltage at Vtun_PROG and the drain of MN3. In order to output the vtun voltage on Vtun_PROG, row_prog_en_b is set low to turn MN6 off and thus MN3 is turned off to cause Vout_PROG to output the vtun voltage. In embodiments where MN3 is embodied as an LDMOS, it handles the vtun voltage at its drain with VDD (e.g., 5V) applied at its gate. Other embodiments may use other configurations to protect the MN6 transistor from receiving the full vtun voltage at its drain.

In the second condition of Table 2, the second output branch 302 may alternatively output the ground voltage on Vtun_PROG by setting control signal prog_en_b_vtun high and row_prog_en_b high. As MP9 is inactive high, MP9 decouples the drain of MP9 and node n7 causing MP10 and MP11 to float. Because MP8 applies the vtun voltage to the source of MP9, prog_en_b_vtun is set to the vtun voltage as to also apply the vtun voltage to the gate of MP9 and turn MP9 off. Row_prog_en_b is set high such that MN6 and MN3 conduct to couple Vtun_PROG to ground. Accordingly, Vtun_PROG outputs the ground voltage.

During HV switch 300 operation, the diodes D1, D2, D4, D5, D7 and D8 prevent the source-gate voltage of MP4-MP7, MP10 and MP11 from exceeding design parameters of the transistors, which may cause degradation of the gate oxide and even failure of the device itself. Diodes D2, D6, and D9 enable the voltage at nodes n3, n6, and n9, respectively, to be maintained at a voltage of vtun_bias plus the drop across the diode while preventing the application of vtun_bias at nodes n2, n5 and n8.

Embodiments of HV switch 300 may include additional output branches configured similar to that of the second output branch 302 with a set of two control signals. Each additional output branch, like the second output branch 302, shares the common branch 303. As the common branch 303 is shared, a net of only nine transistors (including transistors configured as diodes) is added for each new output for the multiple output HV switch 300. In contrast, an HV switch (e.g., switch 100) with only a single output utilizes sixteen transistors (including transistors configured as diodes) for each instance. Further, only one LDMOS device is needed for each additional output branch of the multiple output HV switch 300 while the single output HV switch 100 utilized two LDMOS devices. Eliminating redundancy of larger LDMOS devices in the multiple output HV switch 300 results in further area savings over multiple discrete single output HV switches 100.

Figure 3B:
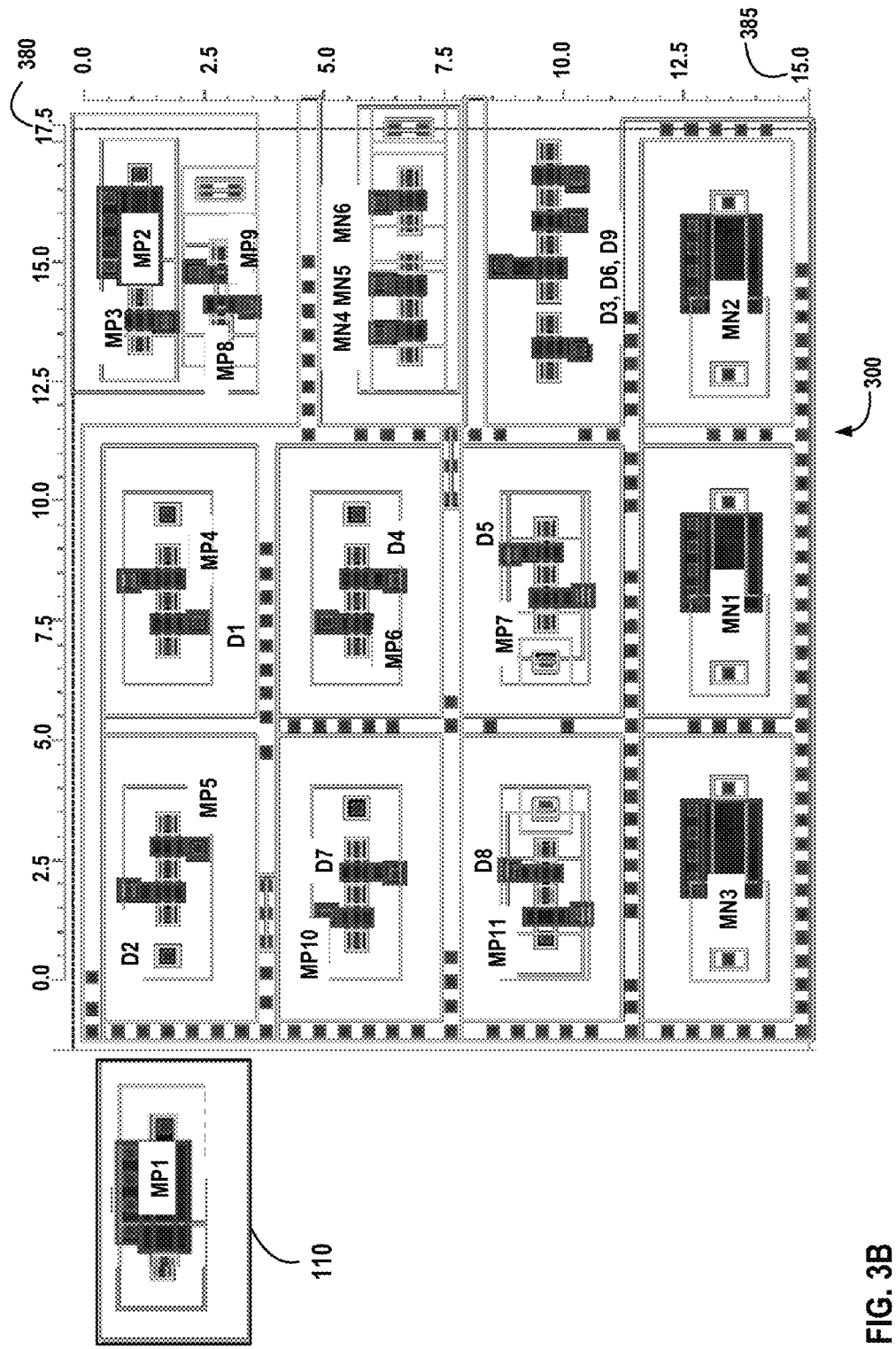
FIG. 3B illustrates an example layout of the HV switch 300 illustrated in FIG. 3A providing both program and erase voltages to a memory block, according to one embodiment.

FIG. 3B illustrates an example layout of the HV switch 300 illustrated in FIG. 3A providing both program and erase voltages to a memory block, according to one embodiment. As shown, the multiple output HV switch 300 layout includes pMOS devices MP2 through MP11, LDMOS devices MN1 through MN3, nMOS devices MN4-MN6, and diodes D1-D9. In one embodiment, the layout features are formed using an 0.18 μm CMOS process with the diodes D1 through D9 formed using transistor devices configured as diodes. Also illustrated is the shared bias circuit 110 including MP1 for providing bias voltages to the multiple output HV switch 300.

The example layout illustrates an overall circuit (excluding the bias circuit 110) having an approximate width 380 of 17.5 μm by an approximate length 385 of 15 μm. Importantly, the signal level devices MP2-MP11, MN4-MN6 and diodes D1-D9 individually have a very small feature size, thus allowing a relatively high density in comparison to the larger LDMOS devices MN1, MN2 and MN3 having different construction due to the lateral diffusion region for handling high voltages at their drains.

For a typical memory block, two HV inputs are required to perform program and erase functions. Traditionally, two HV switches 100A, 100B (shown in FIG. 2) are used to provide, separately, these voltages for memory program and erase functions. This results in significant circuit area and factors into design cost.

As a result of sharing the common branch for multiple outputs, the single HV switch 300 with two HV outputs (with two output branches) has a reduced area over the set of two traditional HV switches 100A, 100B shown in FIG. 2 by about 25%. If additional output branches are added, the overall area savings approaches 50% as the common branch (about half of the area of the single output HV switch) is shared across the additional output branches.

Figure 4:
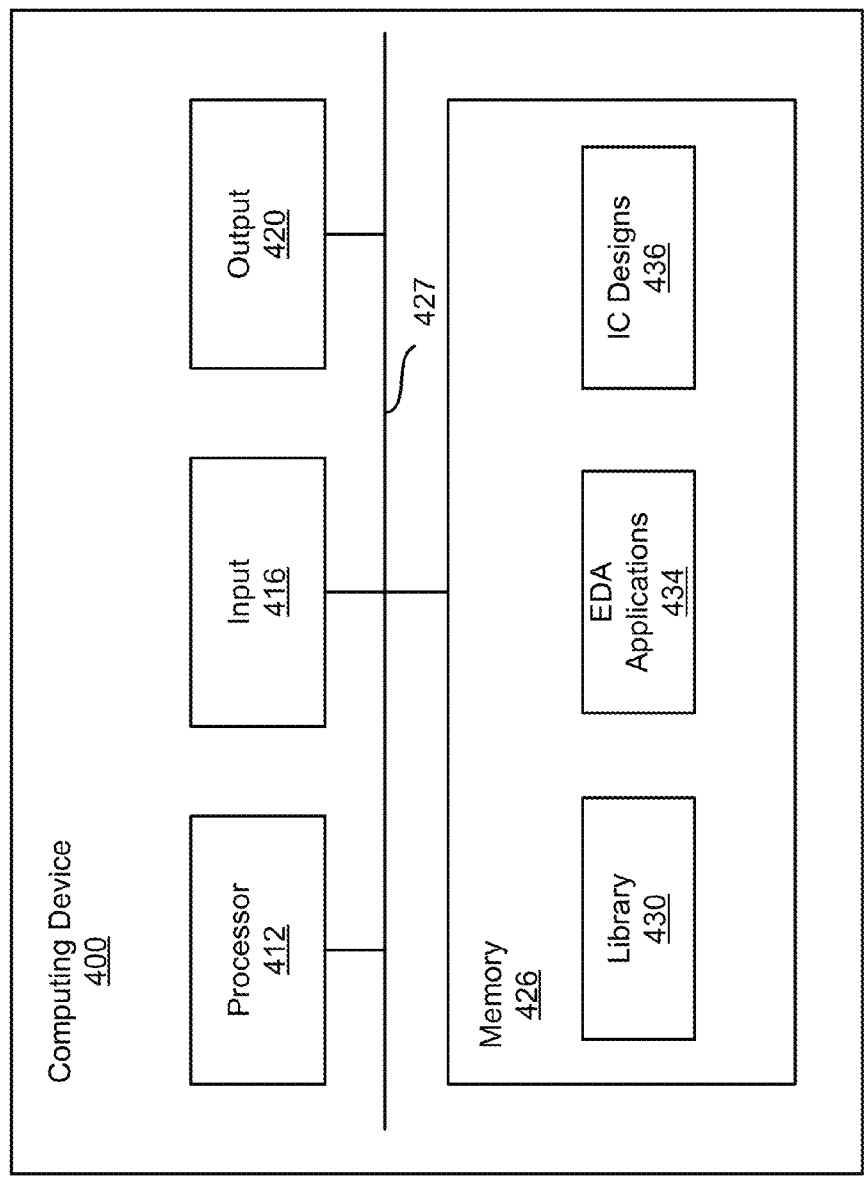
FIG. 4 is a block diagram of a computing device 400 for performing designing operations associated with HV switching circuits, according to one embodiment.

FIG. 4 is a block diagram of a computing device 400 for performing designing operations associated with HV switching circuits, according to one embodiment. The computer device 400 may include, among other components, a processor 412, an input module 416, an output module 420, a memory 426 and a bus 427 for connecting these components. The processor 412 executes instructions stored in the memory 426. The input module 416 may include various devices for receiving user input, including keyboards and pointing devices (e.g., mouse and touch screen). The output module 420 includes a display device or interface device for communicating with the display device.

The memory 426 is a non-transitory computer readable storage medium storing, among others, library 430, electronic design automation (EDA) applications 434 and integrated circuit (IC) designs 436. The library 430 may include data on various circuit components, including instances of the HV switches 100, 300, configuration of common branch 303 and first output branch 301, and additional output branches such as second output branch 302 described herein. The EDA applications 434 may include various software programs for designing ICs including HV switch configurations, including place and route tools, synthesis tools, and verification tools. The design processed by the EDA applications 434 may be stored in IC designs 436. The IC designs 436 may be an entire operational circuit or a part of a larger IC circuit (e.g., a HV switching block or memory block with HV switches).

Figure 5:
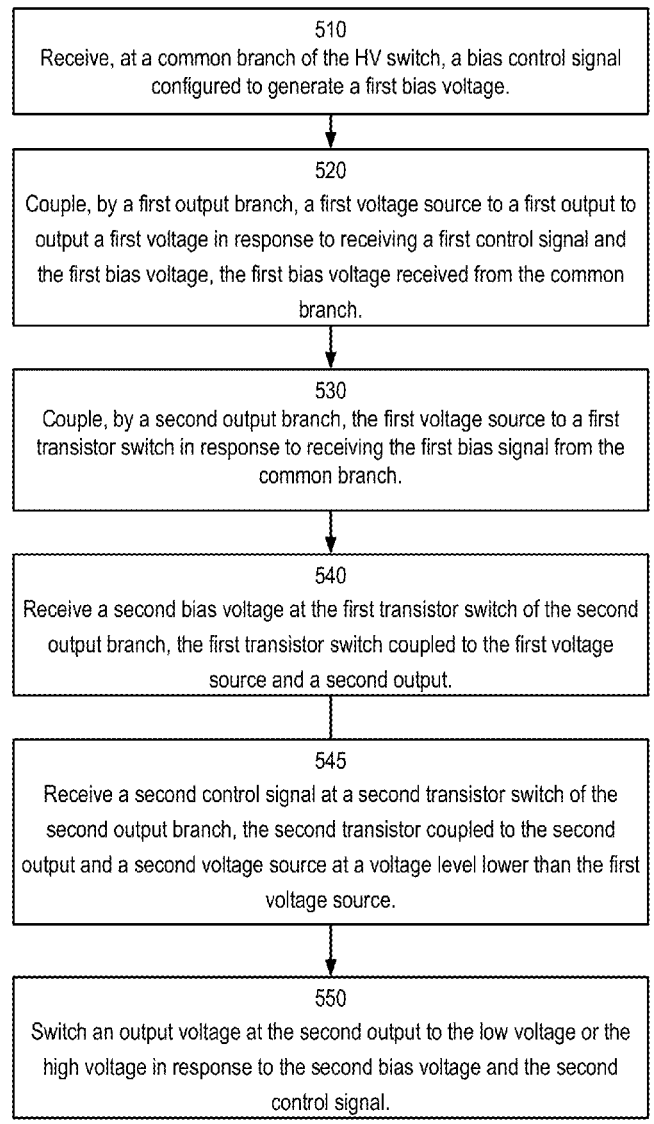
FIG. 5 is a flowchart illustrating a method of operating a HV switch configured to pass multiple HV signals, according to one embodiment.

FIG. 5 is a flowchart illustrating a method of operating a HV switch configured to pass multiple HV signals, according to one embodiment. The HV switch configured to pass multiple HV signals may be designed similar to the HV switch 300 illustrated in FIG. 3A.

The common branch of the HV switch receives 510 a bias control signal (e.g., the bias voltage from current mirror 110) configured to generate a first bias voltage (e.g., at node n1) applied at the output branches. For example, the HV switching may include first and second output branches such that two outputs may be provided to a memory device for erase and program functions.

The common branch provides the first bias voltage to the first output branch. The first output branch couples 520 a first voltage source (e.g., vtun) to a first output to output a first voltage in response to receiving a first control signal and the first bias voltage, the first bias voltage received from the common branch.

Additionally, the common branch provides the first bias voltage to the second output branch. The second output branch couples 530 the first voltage source to a first transistor switch (e.g., MP9) in response to receiving the first bias signal from the common branch.

The second output branch receives 540 a second bias voltage at the first transistor switch coupled to the first voltage source and a second output and receives 545 a second control signal at a second transistor switch coupled to the second output and a second voltage source at a voltage level lower than the first voltage source.

In response to the second bias voltage and the second control signal, an output voltage at the second output is switched 550 to the low voltage or the high voltage.

While particular embodiments and applications have been illustrated and described, it is to be understood that the embodiments are not limited to the precise construction and components disclosed herein and that various modifications, changes and variations may be made in the arrangement, operation and details of the method and apparatus disclosed herein.

What is claimed is:

1. A high-voltage (HV) switch with multiple outputs, comprising:
   a first output branch configured to provide a first voltage output switching between a first voltage level and a second voltage level lower than the first voltage level based on a first bias voltage and a first control signal;
   a second output branch configured to provide a second voltage output based on the first bias voltage, a second bias voltage, and a second control signal, the second voltage output switched between the first voltage level and the second voltage level according to the second bias voltage and the second control signal in response to placing the first voltage output at the first voltage level; and
   a common branch coupled to the first and second output branches to provide the first bias voltage to the first output branch and the second output branch in response to receiving the first control signal.

2. The HV switch of claim 1, wherein the second output branch is coupled between a high-voltage line and a low-voltage line.

3. The HV switch of claim 2, wherein a first bias terminal of the second output branch is coupled between the high-voltage line and a second bias terminal, the first bias terminal configured to operatively couple a node of the second output branch and the high-voltage line in response to a change in the first bias voltage.

4. The HV switch of claim 3, wherein the second bias terminal of the second output branch is coupled between the node of the second output branch and an output terminal of the second branch, the second bias terminal of the second output branch configured to operatively couple the node of the second output branch and the output terminal to provide the high-voltage at the output terminal in response to a change in the second bias voltage.

5. The HV switch of claim 2, wherein an input terminal of the second output branch is coupled between the low-voltage line and an output terminal of the second branch, the input terminal of the second output branch configured to operatively couple the output terminal and the low-voltage line to provide the low-voltage at the output terminal in response to the second control signal.

6. The HV switch of claim 4, wherein the second bias terminal of the second output branch is coupled between the node of the second output branch and the output terminal of the second branch, the second bias terminal of the second output branch configured to operatively decouple the node of the second output branch and the output terminal to provide the low-voltage at the output terminal in response to a change in the second bias voltage.

7. The HV switch of claim 1, wherein the first output branch is coupled between a high-voltage line and a low-voltage line and is configured to switch the first voltage output in response to changes in the first bias voltage and the first control signal.

8. The HV switch of claim 7, wherein a bias terminal of the first output branch is coupled between the high-voltage line and an output terminal of the first output branch, the bias terminal of the first output branch configured to operatively couple the output terminal and the high-voltage line to provide the high-voltage at the output terminal in response to the first bias voltage.

9. The HV switch of claim 7, wherein an input terminal of the first output branch is coupled between the low-voltage line and an output terminal, the input terminal of the first output branch configured to operatively couple the output terminal and the low-voltage line to provide the low-voltage at the output terminal in response to the first control signal.

10. The HV switch of claim 1, wherein the common branch is coupled between a high-voltage line and a low-voltage line and is configured to operatively couple the low-voltage line and the high-voltage line to generate the first bias voltage in response to the first control signal.

11. The HV switch of claim 1, further comprising a third output branch configured to provide a third voltage output, the third output branch comprising:
a first bias terminal for receiving the first bias voltage, a second bias terminal for receiving a third bias voltage, and an input terminal for receiving a third control signal, the third output branch providing the third voltage output in response to the first bias voltage, the third bias voltage, and the third control signal, where the third voltage output is switched between a high voltage and a low voltage in response to placing the first voltage output at the first voltage level and according to the third bias voltage and the third control signal.

12. A method of operating a high-voltage (HV) switch with multiple outputs, the method comprising:
coupling, by a first output branch, a first voltage source to a first output to output a first voltage in response to receiving a first control signal and a first bias voltage, the first bias voltage received from a common branch;
coupling, by a second output branch, the first voltage source to a first transistor switch in response to receiving the first bias signal from the common branch;
receiving a second bias voltage at the first transistor switch of the second output branch, the first transistor switch coupled to the first voltage source and a second output;
receiving a second control signal at a second transistor switch of the second output branch, the second transistor coupled to the second output and a second voltage source at a voltage level lower than the first voltage source; and
switching an output voltage at the second output to a low voltage or a high voltage in response to the second bias voltage and the second control signal.

13. The method of claim 12, wherein the second voltage output is switched between the low voltage and the high voltage according to the second bias voltage and the second control signal in response to placing the first voltage output at the first voltage, where the first voltage is the high voltage.

14. The method of claim 13, further comprising:
coupling, by a third output branch, the first voltage source to a third transistor switch in response to receiving the first bias voltage from the common branch;
receiving a third bias voltage at the third transistor switch of the third output branch, the third transistor switch coupled to the first voltage source and a third output;
receiving a third control signal at a fourth transistor switch of the third output branch, the fourth transistor coupled to the third output and the second voltage source at the voltage level lower than the first voltage source; and
switching an output voltage at the third output to the low voltage or the high voltage in response to the third bias voltage and the third control signal.

15. The method of claim 13, wherein the third output is switched between the low voltage and the high voltage according to the third bias voltage and the third control signal in response to placing the first output at the first voltage, where the first voltage is the high voltage.

16. A non-transitory computer readable storage medium storing an instance of a high-voltage (HV) switch with multiple outputs, comprising:
a first output branch configured to provide a first voltage output switching between a first voltage level and a second voltage level lower than the first voltage level based on a first bias voltage and a first control signal;
a second output branch configured to provide a second voltage output based on the first bias voltage, a second bias voltage, and a second control signal, the second voltage output switched between the first voltage level and the second voltage level according to the second bias voltage and the second control signal in response to placing the first voltage output at the first voltage level; and
a common branch coupled to the first and second output branches to provide the first bias voltage to the first output branch and the second output branch in response to receiving the first control signal.

17. The non-transitory computer readable storage medium of claim 16, wherein the second output branch is coupled between a high-voltage line and a low-voltage line.

18. The non-transitory computer readable storage medium of claim 17, wherein a first bias terminal of the second output branch is coupled between the high-voltage line and a second bias terminal, the first bias terminal configured to operatively couple a node of the second output branch and the high-voltage line in response to a change in the first bias voltage.

19. The non-transistory computer readable storage medium of claim 17, wherein an input terminal of the second output branch is coupled between the low-voltage line and an output terminal of the second branch, the input terminal of the second output branch configured to operatively couple the output terminal and the low-voltage line to provide the low-voltage at the output terminal in response to the second control signal.

20. The non-transistory computer readable storage medium of claim 16, wherein the first output branch is coupled between a high-voltage line and a low-voltage line and is configured to switch the first voltage output in response to changes in the first bias voltage and the first control signal.

\* \* \* \* \*